United States Patent
Swallow et al.

(10) Patent No.: US 8,669,195 B2
(45) Date of Patent: Mar. 11, 2014

(54) ELECTRICAL COMPONENTS AND CIRCUITS CONSTRUCTED AS TEXTILES

(71) Applicants: Stanley Shigezo Swallow, Laleham (GB); Asha Peta-Thompson, Laleham (GB)

(72) Inventors: Stanley Shigezo Swallow, Laleham (GB); Asha Peta-Thompson, Laleham (GB)

(73) Assignee: Intelligent Textiles Limited (GB)

( * ) Notice: Subject to any disclaimer, the term of this patent is extended or adjusted under 35 U.S.C. 154(b) by 0 days.

(21) Appl. No.: 13/628,287

(22) Filed: Sep. 27, 2012

(65) Prior Publication Data

US 2013/0020313 A1   Jan. 24, 2013

Related U.S. Application Data

(62) Division of application No. 10/598,373, filed on Dec. 27, 2006, now Pat. No. 8,298,968.

(51) Int. Cl.
*D03D 15/00* (2006.01)

(52) U.S. Cl.
USPC ........... 442/229; 345/178; 345/179; 442/181; 442/228

(58) Field of Classification Search
USPC .................. 442/181, 228, 229; 345/173, 174
See application file for complete search history.

(56) References Cited

U.S. PATENT DOCUMENTS

| | | |
|---|---|---|
| 3,378,629 A | 4/1968 | Stanley |
| 3,414,666 A | 12/1968 | Doundoulakis et al. |
| 3,513,297 A | 5/1970 | Jordan |
| 3,711,627 A | 1/1973 | Maringulov |
| 3,798,370 A | 3/1974 | Hurst |
| 3,911,215 A | 10/1975 | Hurst et al. |
| 4,080,519 A | 3/1978 | Michalson |
| 4,085,302 A | 4/1978 | Zenk et al. |
| 4,220,815 A | 9/1980 | Gibson et al. |
| 4,484,038 A | 11/1984 | Dorman et al. |
| 4,538,054 A | 8/1985 | De La Bretoneire et al. |
| 4,659,873 A | 4/1987 | Gibson et al. |
| 4,687,885 A | 8/1987 | Talmage, Jr. et al. |
| 4,707,845 A | 11/1987 | Krein et al. |
| 4,715,235 A | 12/1987 | Fukui et al. |
| 4,776,160 A | 10/1988 | Rees |

(Continued)

FOREIGN PATENT DOCUMENTS

| | | |
|---|---|---|
| DE | 42 36 187 A1 | 5/1993 |
| EP | 0 161 895 A2 | 12/1985 |

(Continued)

OTHER PUBLICATIONS

Lind et al. (1997). A Sensate liner for personnel monitoring applications. Proc. 1st IEEE Int. Symp. on Wearable Computers (ISWC'97). Oct. 1997. Cambridge, Mass., USA: IEEE Press.

(Continued)

*Primary Examiner* — Peter Y Choi
(74) *Attorney, Agent, or Firm* — Craig A. Fieschko, Esq.; DeWitt Ross & Stevens S.C.

(57) ABSTRACT

Electrical components are formed in a fabric during the weaving process by a series of crossing conductors in the warp and weft fibers of the fabric. Some of the crossing points provide permanent Separation of the crossing conductors, others permanent connection of the crossing conductors and others connection upon the application of pressure to the fabric. The structure provides the possibility of forming a greater range of components and more reliable component characteristics than heretofore possible.

19 Claims, 12 Drawing Sheets

(56) References Cited

U.S. PATENT DOCUMENTS

| | | | |
|---|---|---|---|
| 4,795,998 A | 1/1989 | Dunbar et al. |
| 4,798,919 A | 1/1989 | Miessler et al. |
| 4,822,957 A | 4/1989 | Talmage, Jr. et al. |
| 4,933,660 A | 6/1990 | Wynne, Jr. |
| 5,047,602 A | 9/1991 | Lipka |
| 5,060,527 A | 10/1991 | Burgess |
| 5,159,159 A | 10/1992 | Asher |
| 5,220,136 A | 6/1993 | Kent |
| 5,262,778 A | 11/1993 | Saunders |
| 5,422,462 A | 6/1995 | Kishimoto |
| 5,453,941 A | 9/1995 | Yoshikawa |
| 5,686,705 A | 11/1997 | Conroy et al. |
| 5,815,139 A | 9/1998 | Yoshikawa et al. |
| 5,852,260 A | 12/1998 | Yoshikawa |
| 5,878,620 A | 3/1999 | Gilbert et al. |
| 5,881,547 A | 3/1999 | Chiou et al. |
| 6,032,450 A | 3/2000 | Blum |
| 6,210,771 B1 | 4/2001 | Post et al. |
| 6,216,546 B1 | 4/2001 | Bahr |
| 6,319,015 B1 | 11/2001 | Faunce |
| 6,333,736 B1 | 12/2001 | Sandbach |
| 6,488,564 B1 | 12/2002 | Gray |
| 6,852,395 B2 | 2/2005 | Dhawan et al. |
| 2001/0006173 A1 | 7/2001 | Rock et al. |
| 2003/0211797 A1 | 11/2003 | Hill et al. |

FOREIGN PATENT DOCUMENTS

| | | |
|---|---|---|
| EP | 0 172 783 A2 | 2/1986 |
| EP | 0 210 063 A2 | 6/1986 |
| EP | 0 194 861 A2 | 9/1986 |
| EP | 0 206 450 A2 | 12/1986 |
| EP | 0 222 239 B1 | 5/1987 |
| EP | 0 392 736 A2 | 4/1990 |
| EP | 0 454 269 A2 | 4/1991 |
| EP | 0 855 307 A2 | 7/1998 |
| EP | 0 911 435 A2 | 4/1999 |
| EP | 0 989 509 A2 | 3/2000 |
| EP | 1 339 259 A | 8/2003 |
| GB | 1 331 942 | 9/1973 |
| GB | 1 516 004 | 6/1978 |
| GB | 2 095 036 A | 9/1982 |
| GB | 2 115 555 A | 9/1983 |
| GB | 2 134 719 A | 8/1984 |
| GB | 2 222 485 A | 3/1990 |
| GB | 2 339 495 A | 5/1998 |
| GB | 2 341 929 A | 9/1998 |
| GB | 2 339 495 A | 1/2000 |
| GB | 2 341 933 A | 3/2000 |
| GB | 2 341 978 A | 3/2000 |
| GB | 2 343 516 A | 5/2000 |
| JP | 5 801 7331 | 2/1983 |
| RU | 2 046 552 C1 | 10/1995 |
| RU | 2 145 984 C1 | 2/2000 |
| RU | 2 155 461 C1 | 8/2000 |
| RU | 2 187 907 C1 | 8/2002 |
| WO | WO 86 05678 A1 | 3/1986 |
| WO | WO 90 10204 A1 | 9/1990 |
| WO | WO 99 26627 A1 | 6/1999 |
| WO | WO 00 26627 A1 | 5/2000 |
| WO | WO 00 60357 A1 | 10/2000 |
| WO | WO 01/75778 A1 | 10/2001 |

OTHER PUBLICATIONS

Orth et al., (1998). Fabric computing interfaces. Proc. ACM CHI '98. Apr. 1998. Los Angeles, CA., USA: ACM Press.

Post et al., (1997). Smart fabric, or washable computing. Proc. 1st IEEE Int. Symp. on Wearable Computers (ISWC'97). Oct. 1997. Cambridge, Mass., USA: IEEE Press.

☒ - insulating fibre or yarn

■ - conductive fibre or yarn

ELECTRICAL COMPONENTS AND CIRCUITS CONSTRUCTED AS TEXTILES

CROSS-REFERENCE TO RELATED APPLICATIONS

This application is a divisional of U.S. application Ser. No. 10/598,373 filed 27 Dec. 2006, which is in turn a national filing under 35 USC §371 of International (PCT) Appln. PCT/GB2005/000712 filed 25 Feb. 2005, which in turn claims priority to GB 0404419.4 filed 27 Feb. 2004. The entireties of these prior applications are incorporated herein by reference.

FIELD OF THE INVENTION

The present invention relates to the provision and incorporation of electrical components with a textile.

BACKGROUND OF THE INVENTION

The applicants' earlier patent application WO-01/75778 discloses several embodiments of localised yarn structures in woven, knitted and non-woven textiles that incorporate both electrically conductive and electrically insulative yarns for the purposes of constructing switches and pressure sensors therefrom.

These structures and arrangements of yarns are principally concerned with controlling the amount of electrical contact that occurs between two or more electrically conductive yarns, or analogous elongate electrical conductors, that cross over one another within the plane of the textile. Techniques are described in WO-01/75778 whereby the aforementioned electrically conductive yarns can be affixed in permanent electrical contact with one another, or permanently separated by insulative yarns and/or an air gap such that no electrical contact takes place between them.

Certain structures and manufacturing parameters allow for the latter (separated) case to become extended in function, such that the conductive yarns remain electrically separate until a mechanical force is exerted upon the textile structure in a direction substantially perpendicular to the plane of the fabric. Under this condition, one or other of the separated electrically conductive yarns can be made to traverse the separating air gap and/or push aside the insulative elements and thus be brought into electrical contact with the other conductive yarn or yarns. This structure thus constitutes a mechanically actuated electrical switch, sensitive to force or pressure.

Preferably, the types of crossover structures used from patent application WO-01/75778 are those pertaining to woven fabrics that incorporate non-composite conductive yarns; that is monofilament yarns or multifilament yarns comprising a plurality of similar monofilaments, that exhibit a uniformly conductive outer surface. This excludes those composite yarns described in WO-01/5778 that comprise both conductive and insulative elements but includes the majority of commercially available conductive yarns, which tend to be composed of pure metallic conductive filaments or filaments that are uniformly coated with a metallic or non-metallic (usually carbon) conductive material.

The preferred separation technique for use with non-composite conductive yarns in a woven textile is the use of a weave structure with floats, a term applied to a portion of weft yarn that passes over or under more than one warp yarn or vice-versa, as described in WO-01/75778.

The majority of prior art on textile resistive elements is concerned with electrical heating. Much of this prior art, for instance US-2001/0002669, U.S. Pat. No. 6,452,138, GB-A-657,729 and GB-A-428,036, is in turn concerned with the creation of a suitably flexible non-textile heating element which is then incorporated in or appended to a textile substrate. In some cases, for instance U.S. Pat. Nos. 6,172,344, 4,764,665 and 4,149,066, the heating element is formed as an electrically conductive coating or surface upon a textile substrate. These techniques suffer the disadvantages of complex, many-stage production processes and deterioration in use due to the heating element or material becoming separated from its textile substrate.

SUMMARY OF THE INVENTION

The present invention seeks to provide an improved fabric with electrical characteristics and electrical components within a textile, preferably a woven textile.

According to an aspect of the present invention, there is provided a woven fabric including in its woven construction a first elongated electrical conductor crossed by a second elongated electrical conductor, said conductors being permanently biased apart at the crossover point.

Preferably, the fabric has a plurality of spaced first conductors and/or a plurality of spaced second conductors thereby forming a plurality of said crossover points. The conductors may comprise electrically conductive filaments or fibres.

Advantageously, the warp includes at least one said first electrical conductor and the weft includes at least one said second electrical conductor.

Insulating fibres or filaments may be provided which bias the first and second electrical conductors apart at a crossover point. Preferably, the woven structure includes warp and/or weft floats over or under more than one yarn to effect the biasing apart of first and second electrical conductors at a crossover point.

Preferably, the first and/or second electrical conductor is subject to a warp and/or weft float over or under more than one yarn.

The neighbouring insulating warp fibres to an electrical conductor in the warp may be subject to a warp float over or under more than one weft yarn.

Advantageously, the neighbouring insulating weft fibres to an electrical conductor in the weft are subject to a weft float over or under more than one warp yarn.

In the preferred embodiment, the fabric employs during the weaving thereof separate shafts for an electrical conductor in the warp and the insulating fibres in the warp that are neighbouring to said electrical conductor.

The biasing apart is preferably effected by locating an electrical conductor of relatively smaller cross-section between neighbouring insulating filaments or fibres of relatively larger cross-section.

The fabric preferably includes at least one instance of a crossover point at which the first and second electrical conductors are permanently biased apart and at least one instance of a crossover point at which the corresponding first and second electrical conductors are permanently physically connected together.

Advantageously, the one or more crossover points at which the corresponding first and second electrical conductors are permanently physically connected together are effected by means of a plain weave structure local to that crossover point.

The fabric may include one or more permanently connected crossover points and one or more permanently biased apart crossover points in order to bring into being at least one conductive path within the fabric that is composed of two or more contiguous segments of two or more electrical conductors.

In the preferred embodiment, the two or more contiguous segments are of two or more electrical conductors that exhibit differing linear resistivities.

The lengths and/or number and/or arrangement and/or linear resistivities of the contiguous segments of electrical conductors are preferably so chosen as to constitute one or more resultant conductive paths that conform to a required geometry and/or a required electrical characteristic and/or a required value of electrical property.

Advantageously, the required electrical property is electrical resistance, capacitance, inductance, impedance or reactance.

Most preferably, the required electrical characteristic is a heterogeneous distribution of resistance along the resultant conductive path and/or across the fabric.

In one embodiment, the fabric provides an electrical heating element. The fabric can provide an electrical heating element that exhibits a heterogeneous distribution of heated power dissipation along the resultant conductive path and/or across the fabric. Similarly, the fabric can provide an electrical sensor or transducer by means of measurement of some electrical property of a conductive path.

Preferably, said measured electrical property includes, but is not limited to, one or more of the properties resistance, capacitance, inductance, impedance and reactance.

Advantageously, the fabric provides an electrical sensor for temperature and wherein the measured electrical property is resistance.

In an embodiment the fabric provides an electrical heating element and an electrical sensor for temperature.

According to another aspect of the present invention, there is provided an electrical component woven in a textile substrate. Advantageously, the component is produced during the process of weaving of the textile, by use of one or more conductive, resistive and insulative elements.

Preferably, at least two separated bus-bars are woven into the textile.

In the preferred embodiment, at least one resistive element is provided in the textile, most preferably provided by a plurality of resistive elements connected to one another in series and/or in parallel. Advantageously, the resistive elements are permanently coupled to one another in an operational state of the device.

Another aspect of the present invention provides the use of cross-over weave structures to allow two or more mutually separated bus bars to be incorporated into a textile during the weaving process.

According to another aspect of the present invention, there is provided an electrical circuit or structure within a textile including a plurality of one or more of conductive, resistive and insulative elements which are pressure actuated into contact, which are permanently unconnected and/or which a fully conductive. The elements are preferably incorporated into the weft and warp fibres of the textile.

The present invention is concerned with the utilisation of these three types of crossover structure, namely permanently connected, permanently unconnected and pressure actuated switch, to construct a wide variety of electrical components in the form of conventionally manufactured textiles.

This "toolbox" of techniques thus comprises: the aforementioned joining and separating weave structures; the row and column arrangement of conductors that results from interspersing conductive yarns amongst insulative yarns in the warp and weft of a woven textile; and the variety of conductivities exhibited by commercially available conductive yarns.

BRIEF DESCRIPTION OF THE DRAWINGS

Embodiments of the present invention are described below, by way of example only, with reference to the accompanying drawings, in which.

DETAILED DESCRIPTION OF PREFERRED VERSIONS OF THE INVENTION

Figure 1:
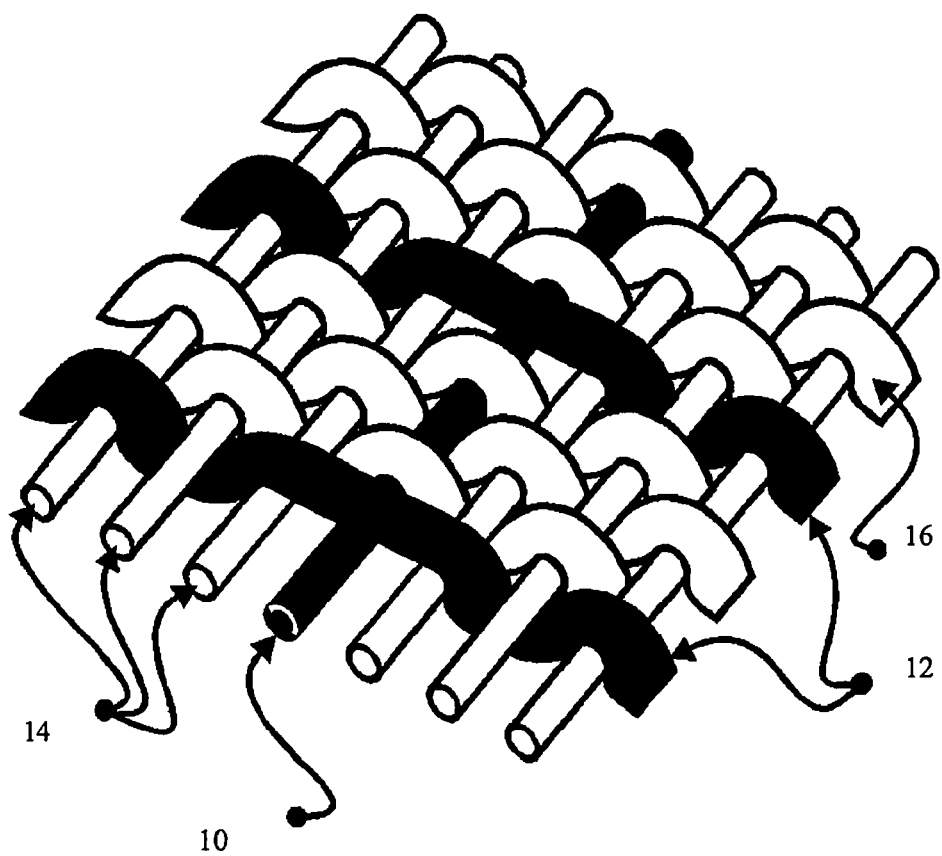
FIG. 1 shows in schematic form a woven piece of fabric, showing conductive and insulative yarns, with weft floats at crossover points between conductors.
Figure 2A:
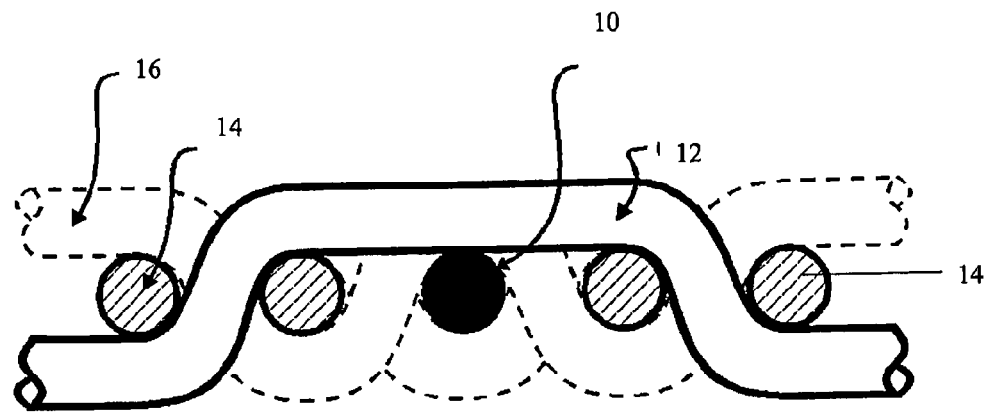
FIG. 2a shows in cross-section woven conductive yarns with a conductive weft filament floated over a conductive warp filament resulting in minimal contact area.
Figure 2B:
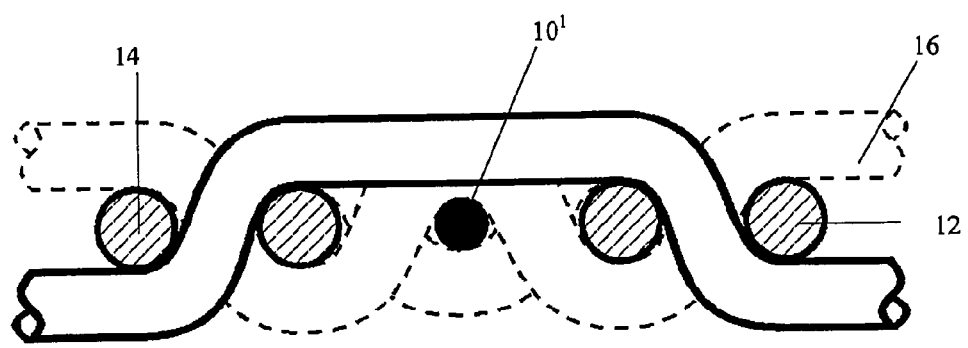
FIG. 2b shows in cross-section woven conductive yarns with a conductive weft filament floated over a smaller diameter conductive warp filament resulting in physical separation.

With reference to FIG. 1, in accordance with the teachings herein, in order to achieve separation of the two conductive yarns 10, 12 at a crossover, typically, the weft conductive yarn 12 is floated over the warp conductive yarn 10 and one or more insulating warp yarns 14 provided to either side, with insulative weft yarns 16 being interdigitated between adjacent conductive weft yarns 12. As a result, the two conductive yarns 10, 12 share little or no physical contact area, as shown in the cross-sectional view, longitudinal to the weft, of FIG. 2(a). If the conductive warp yarn 10' is of smaller diameter than the surrounding insulating warp yarns 14, the physical separation of the two conductive yarns 10, 12 can be effected, as shown in FIG. 2(b).

Figure 2C:
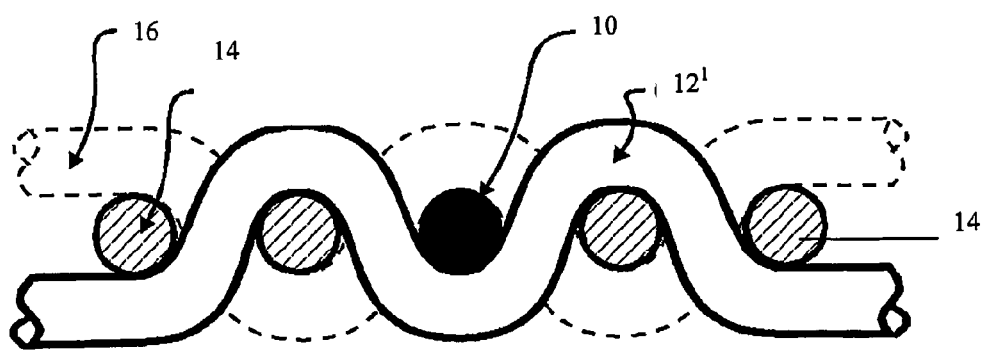
FIG. 2c shows in cross-section woven conductive yarns with a plain weave structure resulting in permanent contact between conductive weft and warp filaments.

Conversely, if it is desired that the two or more conductive yarns 10, 12 make permanent electrical contact at their point of crossing over one another, a plain weave structure is used, as shown in FIG. 2(c). This weave structure guarantees a large contact area between the respective surfaces of the conductive yarns 10, 12 and is particularly efficacious when applied to multifilament yarns, which exhibit a conformable cross-sectional profile.

Figure 3:
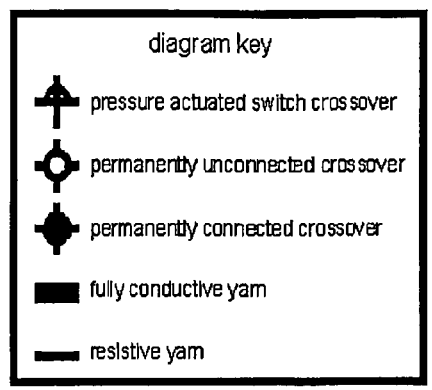
FIG. 3 is a legend for the other Figures, in which only the conductive yarns are shown for the purposes of clarity.

The following description details how the techniques taught herein are used in combination to construct electrical components. A standard notation has been adopted for the accompanying drawings, the legend for which is illustrated in FIG. 3.

According to this legend, three symbols are employed to represent the three types of crossover structure that are available. The first represents a crossover point that is a mechanical switch, using weave structures described in WO-01/75778. The second open circle symbol represents a crossover at which the two or more conductive yarns are permanently separated, using a warp or weft float structure, also described in WO-01/75778. The third filled circle symbol represents a crossover point at which the conductive yarns are permanently connected, through the use of a plain weave structure.

Further, two broad classifications of conductive yarn are represented by the use of heavy or thin lines within the diagrams. Heavy lines represent fully conductive yarns, which are typically metallic in nature. For the purposes of the following analyses, these yarns are assumed to exhibit negligible resistivity, although in practice they may typically exhibit linear resistivities of up to around 10 ohms/cm, and acceptably exhibit linear resistivities of up to 100 ohms/cm.

Thin lines within the diagrams represent resistive yarns, more specifically, conductive yarns which exhibit greater linear resistivity than the fully conductive yarns. These yarns are predominantly based upon carbon as an electrically conductive medium, and depending upon their thickness typically exhibit linear resistivities of between 1,000 and 10,000 ohms/cm. It is also envisaged that these resistive yarns might use semiconductor materials as a resistive medium.

These resistive yarns are distinct again from the insulative yarns that comprise the remainder of the textile. The insulative yarns can be taken from the majority of the range of commercially available yarns, including both natural fibre yarns such as wool, cotton and silk, or man-made fibres such as nylon and polyester.

The insulative yarns are omitted from the drawings for the purposes of clarity, although it is implicit to the designs that each conductive yarn is separated from any other adjacent and parallel conductive yarns by at least one interposed, parallel insulative yarn. Where this is not the case, for instance where a number of yarns are used in parallel to reduce the overall linear resistivity of that length of conductor, the multiplicity of yarns is treated as a single conductive yarn for the purposes of these analyses and descriptions. That is, either of the conductive yarn types described or illustrated within this application may in practice comprise a single yarn or a multiplicity of yarns.

To a certain extent, the drawings are schematic and may be reorganised topologically, akin to a conventional electrical schematic diagram. However, certain dimensions within some of the designs are not topological equivalents and the variation of these distances or arrangements will effect change upon the function of the designs.

The remainder of the dimensions are arbitrary, certainly when these dimensions concern fully conductive yarns, whose resistivity can be considered negligible. This factor enables greater freedom of design as regards the physical layout of a component or circuit when embodied as a piece of textile.

Indeed, the variable topology of the structures allows them to be positioned arbitrarily within a piece of textile, allows many distinct structures to be incorporated within a single piece of textile and allows interconnection between these distinct structures. For example, a single piece of textile might be designed to incorporate a number of resistive elements, transducer elements and switch elements in arbitrarily determined positions, plus the signal and power interconnections and buses between them. A simpler, but very useful advantage of the variable topology is that any connection points that are required between the textile and some external electrical device can also be arbitrarily positioned, usually most usefully towards one edge of the textile.

Resistive Elements

Perhaps the most basic electrical component that can be embodied as a woven textile is the resistor. A resistor will also constitute an impedance or reactance, according to its mode of use. Envisaged applications include, but are not limited to, its use: as a resistance component within a larger circuit; as a matched impedance for either the termination of a transmission line or its use as an antenna; as a resistive heating element; as an effector, where, for example, resistance heating or the creation of magnetic flux effects some physical change in the textile; as a sensor or transducer, where the effective resistance value varies in relation to some external influence such as strain, temperature, incident light levels or magnetic flux.

It is also envisaged in these latter cases that the resistive yarns might use some semiconductor material as a conductive medium, such that a sensing or effecting function is enhanced. For example, the use of a resistive yarn that employed Cadmium Sulphide as a conductive medium would render the yarn, or region of fabric that constitutes the resistive element, greatly sensitive to incident light levels via measurement of its resistance value.

In order for a textile resistive element to be used in most of these applications, some measure of control over the resulting resistance value is required. Consider the simplest manner in which a resistive element can be constructed within a woven textile, with some degree of control over the resultant resistance value. This is illustrated in FIG. 4.

Control of the resistance value is achieved through control of the effective length of a single conductive yarn, or more correctly, a single conductive "end", which may comprise one or more distinct yarns woven in unison.

The effective length refers to the length of the electrical conduction path, through one or more conductive yarns of uniform and known linear resistivity, measured in ohms/unit length. The length of this conduction path may be controlled by the overall length of the piece of textile, or the positioning of two connectors at either extreme of the desired length of conductive yarn.

Figure 4:
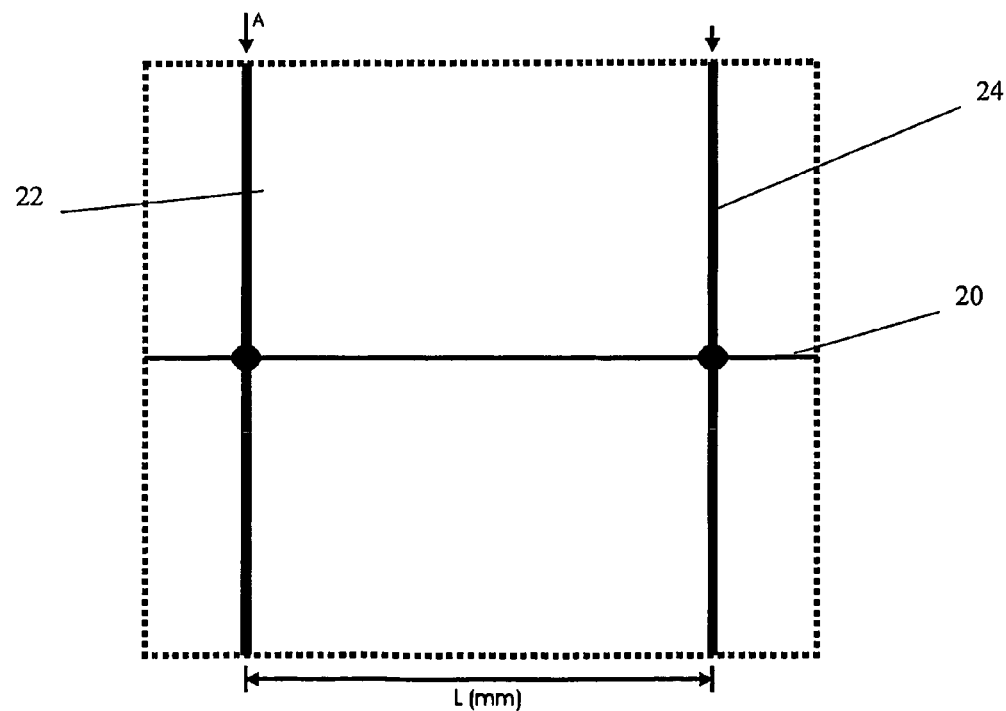
FIG. 4 shows a simple resistive element.

Advantageously, as in the case of FIG. 4, it is possible to control the effective length of a resistive yarn 20 between two fully conductive connector yarns, or bus-bars 22, 24. The effective length of the resistive yarn 20 is thus fixed at time of weaving, through the geometry of the warp design. In this case, and assuming that the resistance of the fully conductive bus-bars is negligible, the resultant resistance of the element is given by:

$$R_{AB} = L \times \rho$$

where, with respect to FIG. 4, $R_{AB}$ is the resultant resistance measured between points A and B, L is the effective length of the resistive yarn 20, or the distance between the bus-bars 20, 22, and $\rho$ is the linear resistivity of the resistive yarn 20, measured in ohms/unit length.

This simple arrangement can suffer a number of drawbacks. Primarily, the range of linear resistivities offered by available conductive yarns is limited, which in turn limits the range of resultant resistances that realistically can be constructed. As previously discussed, available yarns are typically either metallic, all offering similarly low linear resistivities, or carbon-based, offering a relatively high linear resistivity. Achieving many intermediate resistance values can therefore demand unrealistically large or small values of L. Additionally, many applications, such as heating elements and transducers, require the textile resistive elements to conform to certain geometries.

Figure 5:
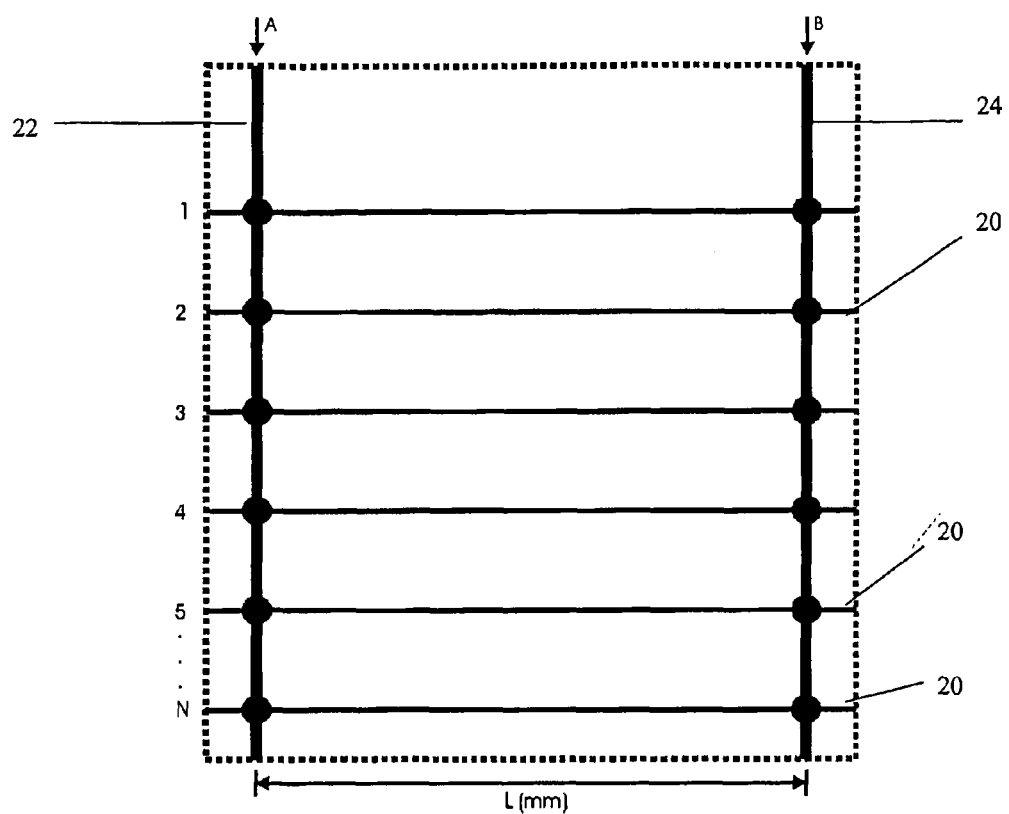
FIG. 5 shows a parallel resistive element.

A partial solution to these drawbacks can be achieved through the use of multiple resistive yarns 20 that are arranged in a parallel array as shown in FIG. 5. These parallel resistive yarns 20 can be electrically connected together at either extreme by perpendicular conductive yarns 22, 24. If fully conductive yarns 22, 24 of negligible resistance are used to electrically connect the parallel array of yarns 20, as in this diagram, the fully conductive yarns constitute electrical bus-bars 22, 24, and the resultant resistance of the element is given by the equation:

$$R_{AB} = (L \times \rho)/N$$

where, with respect to FIG. 5, $R_{AB}$ is the resultant resistance, L is the effective length of the resistive yarns 20, or the distance between the bus-bars 22, 24, $\rho$ is the linear resistivity of the resistive yarn 20 used, measured in ohms/unit length and N is the number of parallel resistive yarns 20.

Structures of this nature can be seen in EP-A-1201806, U.S. Pat. No. 4,538,054, RU-C-2,145,984, RU-C-2,187,907 and RU-C-2,155,461.

The systems seen in this prior art suffer the general disadvantages of yielding only limited ranges of resultant resistance from given yarn resistivities, having complicated manufacturing that involves multiplicities of processes, and yielding resistive elements of limited geometry, large size and homogenous distribution of resistance.

The teachings herein address these disadvantages, by employing the techniques for connecting or not connecting conductive yarns at crossover points.

Figure 6:
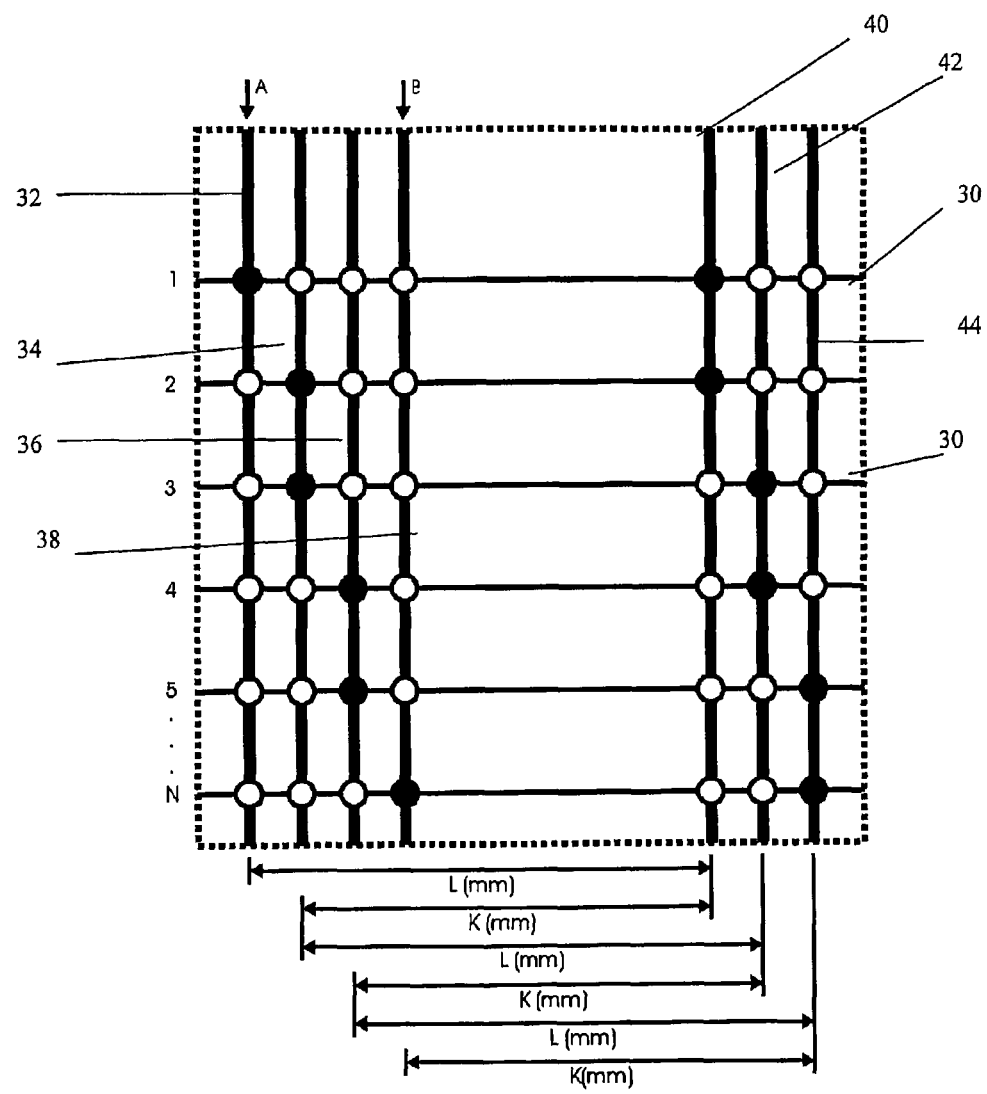
FIG. 6 shows a series resistive element with serpentine structure according to an embodiment of the present invention.

FIG. 6 illustrates a means by which a textile resistive element 30 with a very long effective length can be restructured to fit within a piece of textile of arbitrary proportions. The conductive path between points A and B is arranged in a serpentine manner, passing from one resistive yarn 30 to another in electrical series via the staggered bus-bars 32-44 that are comprised of the perpendicular fully conductive yarns at either extreme of the resistive yarns 30.

In FIG. 6, if the fully conductive yarns that comprise the bus-bars 32-44 are assumed to contribute negligible resistance to the conductive path between points A and B, and the bus-bars at one extreme of the resistive yarns are arranged to be equally spaced to those at the other extreme, according to the dimensions L and K in FIG. 6, then the resultant resistance is given by the sum of the resistive yarns 30 that comprise the effective conductive path. That is:

$$R_{AB} = (L \times \rho) + (K \times \rho) + (L \times \rho) + (K \times \rho) + \ldots$$

and so on, where, with respect to FIG. 6, $R_{AB}$ is the resultant resistance measured between points A and B, K and L are the effective lengths of the resistive yarns 30, or the distances between the bus-bars 32-44, and $\rho$ is the linear resistivity of the resistive yarn, measured in ohms/unit length.

For an arbitrary number of resistive yarns, N, arranged in this manner according to FIG. 6, the overall resultant resistance is given by:

$$R_{AB} = (N/2) \times ((L \times \rho) + (K \times \rho))$$

It is clear that this is an illustrative form of the structure, and that if the resistance of the bus-bars cannot be assumed to be negligible, or the effective lengths of the individual resistive yarns is not so uniform, then the overall resultant resistance can be determined by considering every component of the conductive path in turn. Each component contributes a finite resistance according to its own effective length and linear resistivity, and the overall resultant resistance is the sum of these component resistances, according to the nature of electrical resistances connected in series.

Figure 7:
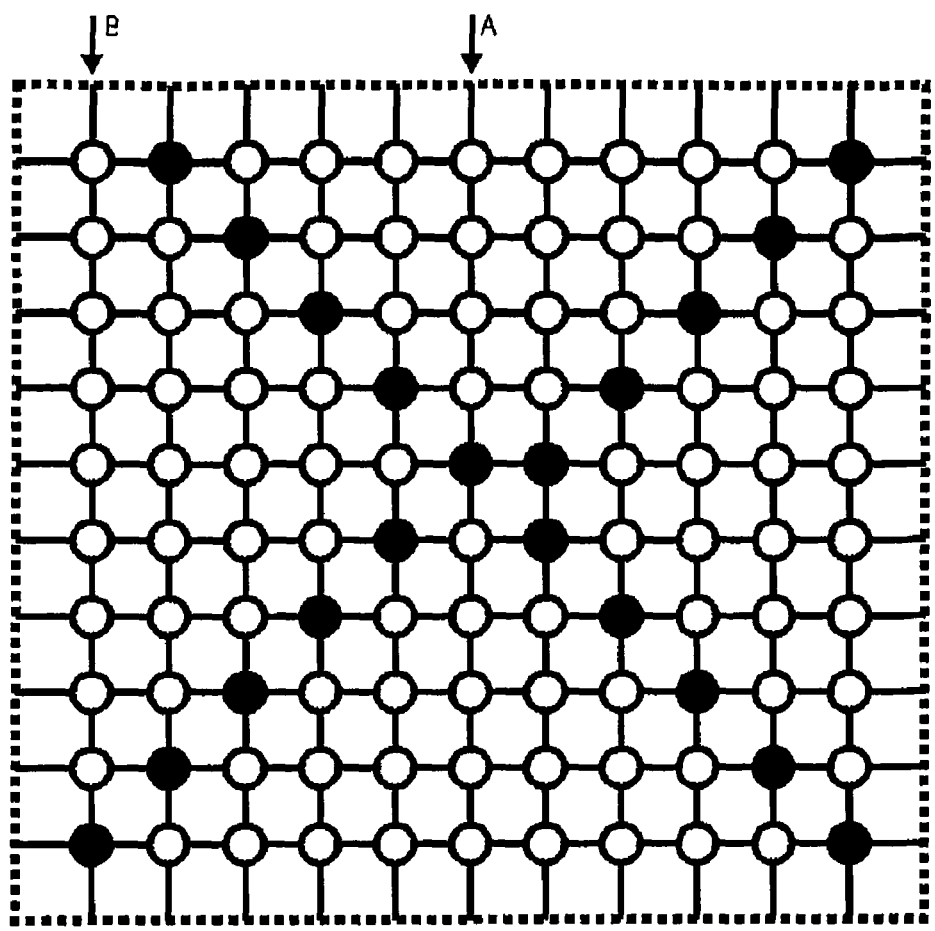
FIG. 7 shows a series resistive element with a spiral structure, according to an embodiment of the invention.

Indeed, there is no real compulsion for a generalised series resistance structure to conform to a serpentine arrangement at all, beyond convenience of annotation and design and a certain convenience of manufacture. Consider the structure of FIG. 7, in which the series resistances of the effective conductive path are arranged in a spiral manner.

Note that these series structures allow greatly improved control over the geometry of resistance elements described thus far, and seen in the prior art. The serpentine structure allows a resistive element to conform to almost any arbitrary rectilinear proportions. A decrease in the dimensions K and L for a given resultant resistance can be compensated for by an increase in N, and vice-versa. Additionally, this series structure can create absolute resistances that are higher in value than the simple resistive element of FIG. 4, for a given dimension L and linear resistivity $\rho$, unlike the parallel structures of FIG. 5 and the prior art, which only allow the creation of lower resistances under the same conditions.

It is a further disadvantage of the parallel resistive structures of FIG. 5 and the prior art that very low resistances, relative to those of the simple resistive element of FIG. 4 for a given dimension L and linear resistivity $\rho$, are difficult to achieve within a controlled geometry. Achieving progressively lower resultant resistances with a parallel structure such as that of FIG. 5 requires that L becomes very small and N becomes very large, and the overall geometry of the resistive element becomes ever-more tall and narrow.

Figure 8:
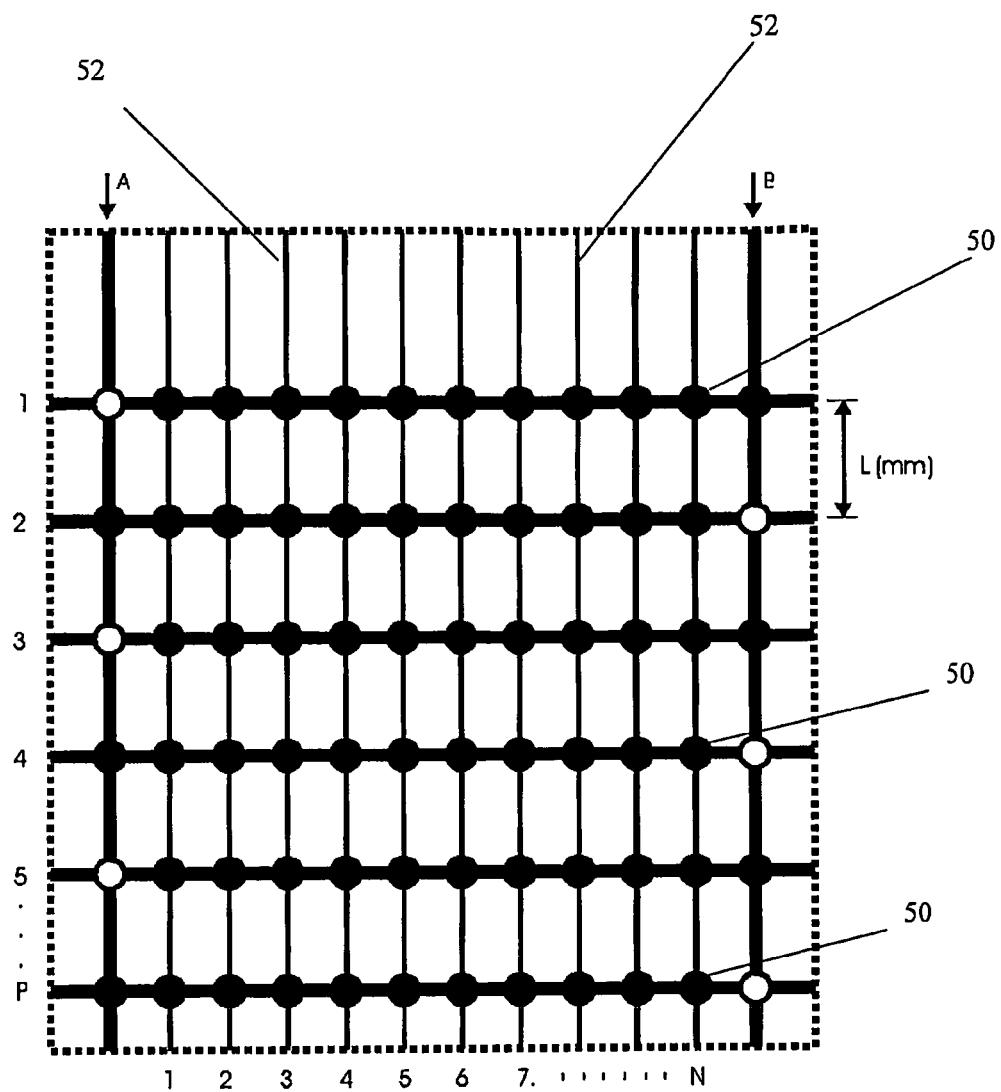
FIG. 8 shows a parallel interlaced resistive element according to an embodiment of the present invention.

The preferred embodiments disclosed herein address this drawback. FIG. 8 illustrates a means by which a textile resistive element with a very high number of parallel conductive paths, each of very short length, can be structured to fit within a piece of textile of arbitrary proportions, and to an extent of arbitrary size.

The effective conductive path between points A and B is split by the bus-bars into a multitude of parallel sub-paths 50, each of which in turn then comprises a parallel structure of the type seen in FIG. 5.

Each bus-bar has become extended by an array of fully conductive yarns, such that its conductive path becomes comb-like in shape. The two comb-shaped bus-bars 50 are staggered within the textile, such that the fingers of the combs become interlaced, but maintain electrical isolation from one another.

It is between these interlaced fingers that the resistive yarns 52 are disposed. Assume there are P interlaced fingers in total, and N resistive yarns, according to FIG. 8. This results in a potentially very high number of parallel conductive paths between points A and B, through the many portions of resistive yarn, yet in a very compact area and making economical use of the resistive yarns. The equivalent circuit for this structure is shown in FIG. 9.

Figure 9:
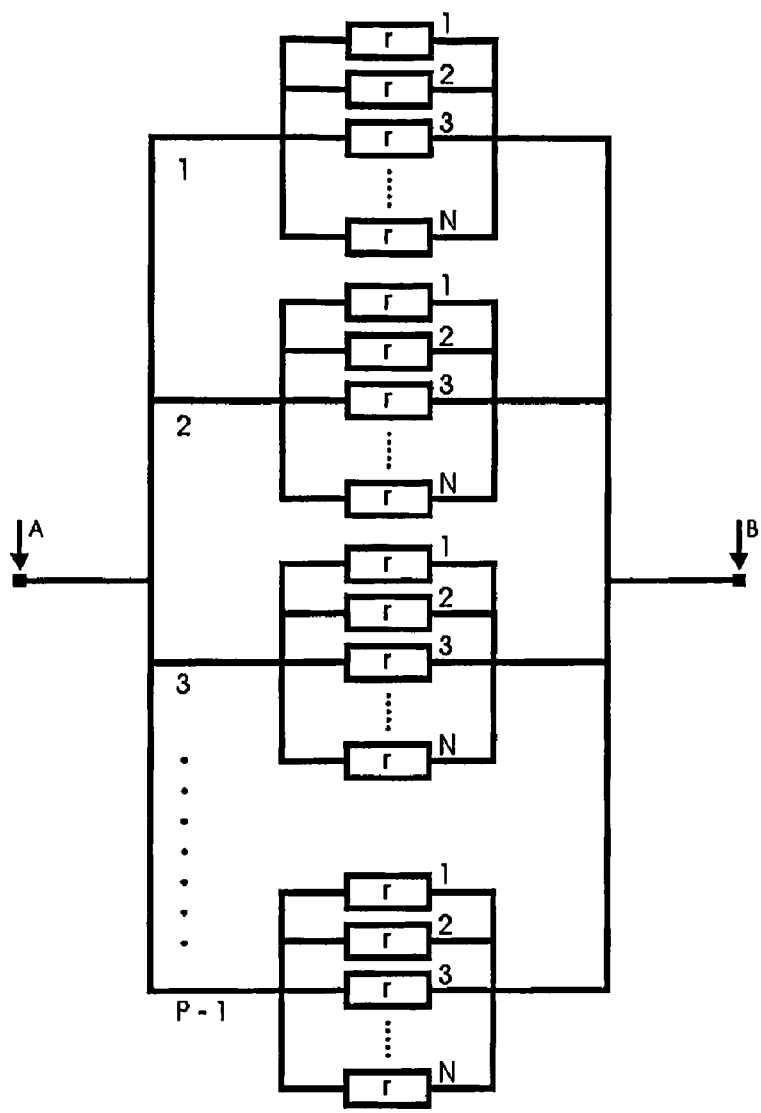
FIG. 9 shows in schematic form an embodiment of parallel interlaced resistive element equivalent circuit.

To analyse this structure, with respect to FIGS. 8 and 9, firstly consider a single elemental resistor of value r, which is formed by a portion of a single resistive yarn of length L. The value of this elemental resistor, r, is given by:

$$R = L \times \rho.$$

where, with respect to FIG. 8, L is the length of the portion of yarn and ρ is the linear resistivity of the resistive yarn 52, measured in ohms/unit length.

Assuming that the yarn portions are all of a similar dimension and composition, and thus that the elemental resistors are all of value r, consider now that there is a multiplicity of such elemental resistors. They are arranged, in the particular instance of FIG. 8, from left to right as rows and numbering N, and also from top to bottom in columns, numbering (P−1). The number of elemental resistors of value r is thus equal to the product of these row and column numbers, such that the overall resultant resistance between points A and B, $R_{AB}$, is given by:

$$R_{AB}=(L \times \rho)/(N \times (P-1))$$

Note that the overall length of the resistive element is given by L×(P−1). Therefore, or a given overall length, if P is increased L is reduced proportionally, both of which effects serve in concert to reduce the resultant resistance. From this it can be seen that even if the ρ term is large, or the number of resistive yarns N is low, or the overall length of the resistive element is required to be very short, the resultant value $R_{AB}$ can still be made very low by increasing the value of P and simultaneously decreasing L.

Thus, the preferred embodiments of structure disclosed herein allow a very broad range of resultant resistances to be generated within a given area and shape of textile and with a limited range of available yarn conductivities. Conversely, a resistive element of a desired resistance can be created in a wide variety of rectilinear shapes and sizes.

A similar electrical structure can be seen in the prior art of RU-C-2,155,461, but which suffers the relative drawbacks that the bus-bars must be appended after the manufacture of the textile, and must also be cut in a further manufacturing process in order to separate the two comb-shaped bus-bars. The manufacturing process is thus greatly more complicated in comparison with the embodiments disclosed herein, in which the use of the crossover weave structures allow the two mutually separated bus-bars to be incorporated within the process of weaving of the substrate textile. Additionally, the prior art's requirement to cut into the fabric limits the smallness and number of resistive elements that can be realistically created within a piece of textile, which in turn limits the range of resultant resistances that can be obtained.

There now follows a description of a typical embodiment which illustrates the practical application of many of the above teachings.

Figure 10:
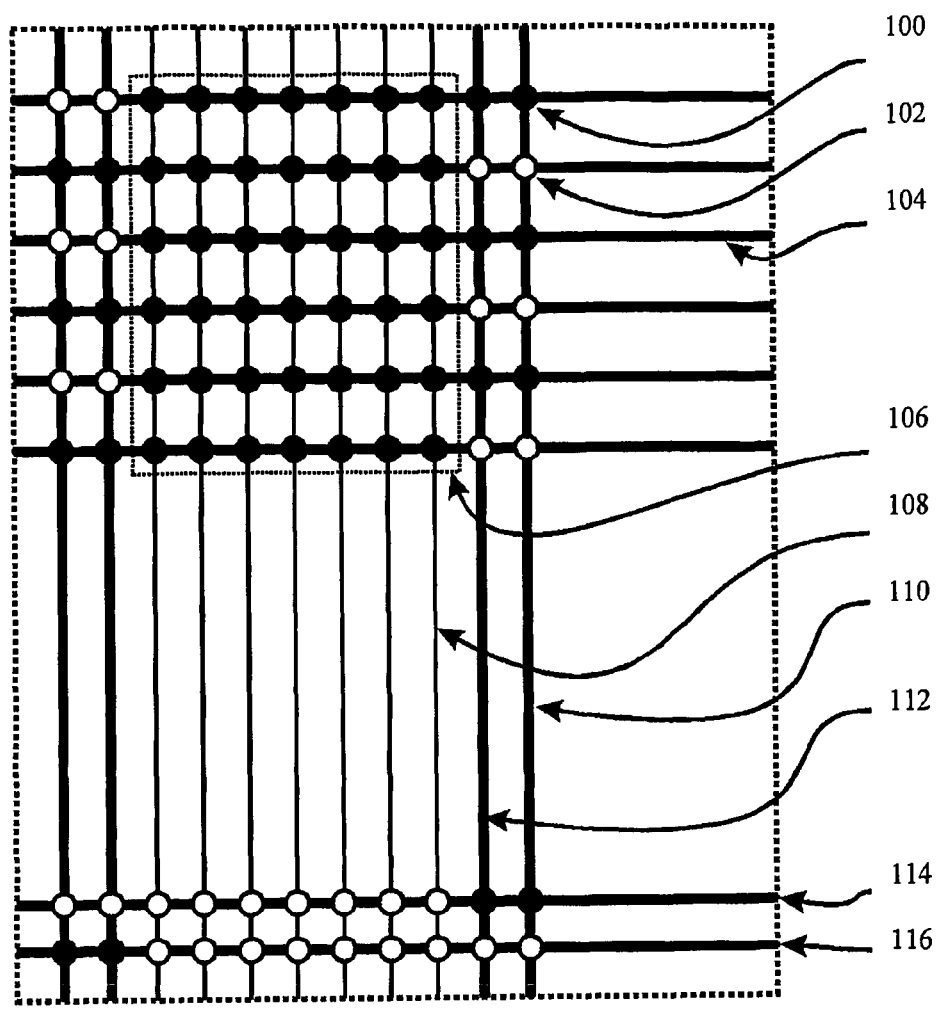
FIG. 10 shows a typical embodiment of fabric circuit.

FIG. 10 represents a section of fabric that is constructed in accordance with some aspects of the teachings herein. The section of fabric incorporates a single resistive element, such as might be employed as a heating element within clothing, furnishings or bedding, for example.

Note that in this Figure, only conductive yarns are shown. The remainder of the section of fabric is composed in this typical embodiment of plain woven ⅔₁₆s cotton, set at 50 warp ends per inch.

With respect to FIG. 10, items 100 and 102 are both crossover points between two conductive yarns. Item 100 is a crossover point at which a plain weave structure is employed to maximise physical contact area and electrical continuity between the first and second conductive yarns.

Figure 11:
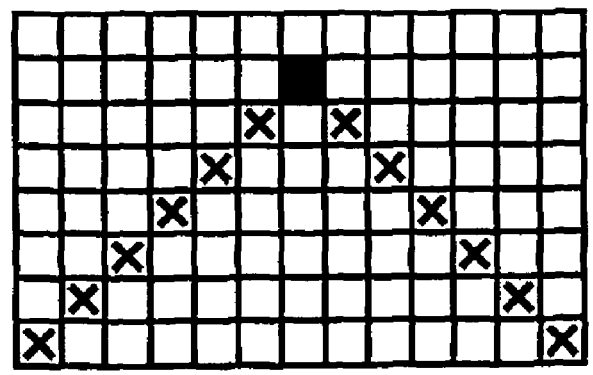
FIG. 11 shows a warp draft and peg plan for a plain weave structure, as employed permanently to connect first and second electrical conductors, useful in the production of the circuit of FIG. 10.
Figure 11:
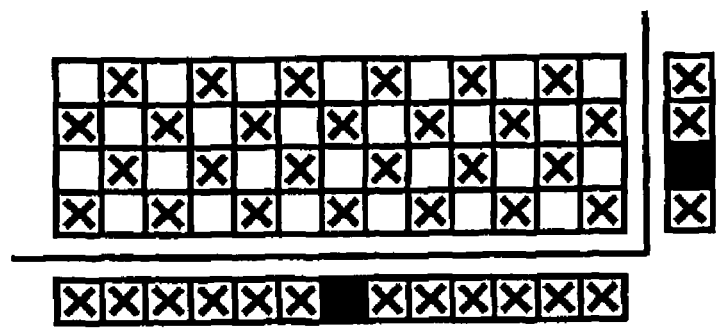

A preferred embodiment of this plain weave structure is illustrated in FIG. 11, as a warp drafting plan, shown at top, and a corresponding peg plan, shown centre. In this diagram, threading is illustrated with a filled black symbol for the weft pick conductive yarn or warp end conductive yarn. A cross symbol is employed for a pick or end of insulating fibre or yarn.

Figure 12:
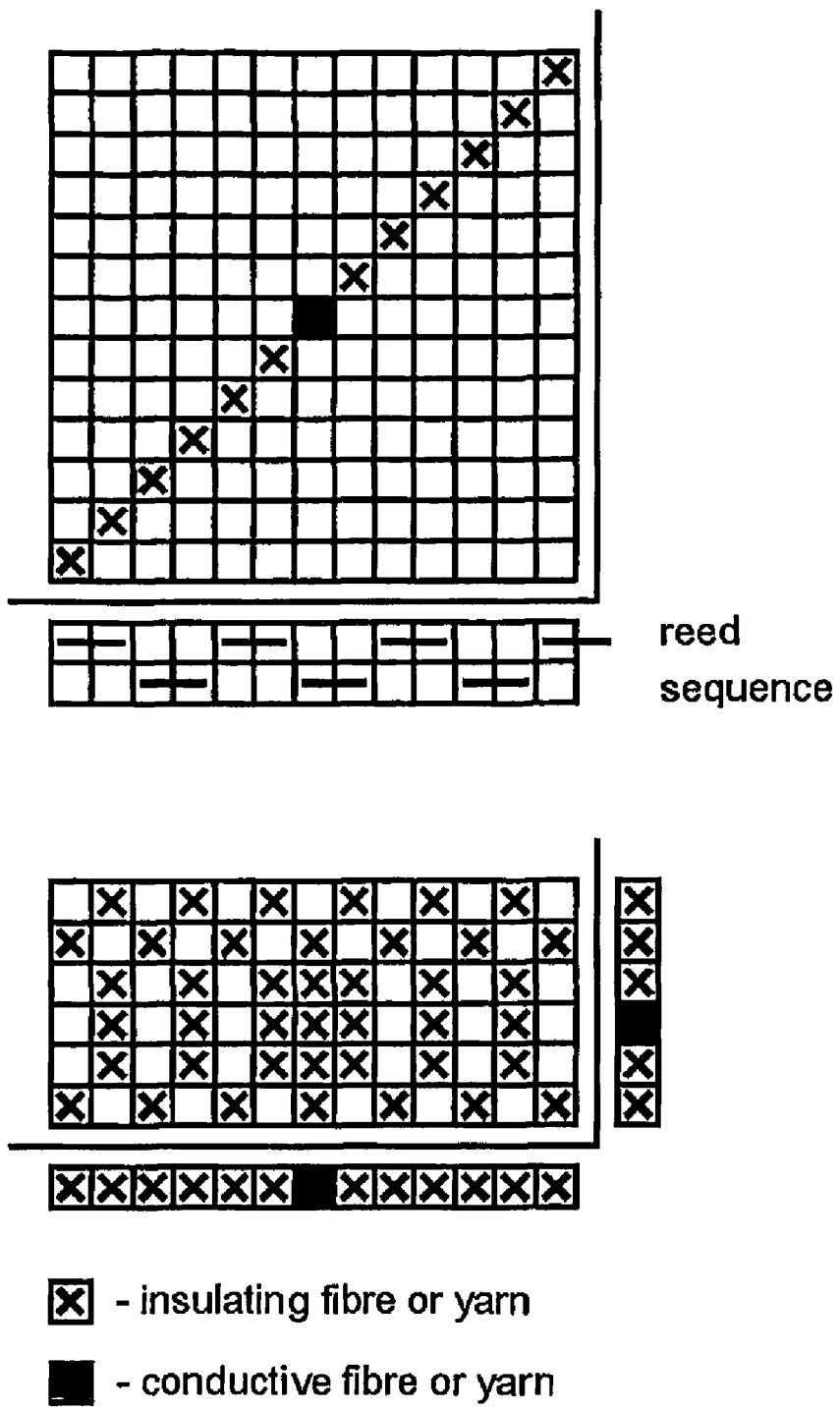
FIG. 12 is a draft and peg plan for a typical float weave structure, as employed to permanently bias apart first and second electrical conductors, useful in the production of the example of FIG. 2b.

With respect again to FIG. 10, item 102 is a crossover point at which a float weave structure is employed to bias apart permanently the first and second conductive yarns. A preferred embodiment of this float weave structure at a crossover point is illustrated in FIG. 12, where threading is denoted as in FIG. 11. This particular preferred embodiment for the float weave structure employs both a weft float over three warp yarns and additionally a warp float over five weft yarns.

Returning again to FIG. 10, item 104 is a highly conductive weft yarn of low or negligible resistance. In a preferred embodiment, this yarn is typically a 235 dtex silver-coated nylon multifilament yarn.

Note the use of this particular yarn item 104 as a constituent interlaced finger of a comb-shaped bus-bar, as described previously. The use of a parallel interlaced resistive element structure of this nature allows the main heating element, outlined in FIG. 10 as item 106, to conform to an arbitrary rectilinear shape and dimension, whilst also conforming to a required resistance value.

The interlaced fingers of the comb-shaped bus-bars, of which item 104 is an instance, are interconnected by means of a plurality of relatively higher resistance conductive yarns in the warp, an example of which is shown as item 108. In a preferred embodiment, this yarn of item 108 is typically a 190 dtex carbon coated nylon multifilament yarn.

Item 110 in FIG. 10 is a highly conductive warp yarn of low or negligible resistance. In this particular instance, this conductive yarn constitutes part of one bus-bar. Note that these highly conductive bus-bars are used to efficiently transmit electrical current to the main heating element 106.

The electrically conductive path through the fabric, between the points marked as 114 and 116, is composed of many contiguously connected segments of conductive yarns. Due to the variety of lengths and linear resistivities of these segments, in addition to the many parallel sub-paths, the fabric can exhibit a heterogeneous distribution of resistance across its surface. This facility is employed, in the case of this example heating embodiment, to predetermine the distribution of heated power dissipation across the surface of the fabric. Power dissipation is concentrated at the main heating element 106. Said heating element may be arbitrarily positioned within the section of fabric.

To this same end, item 112 in FIG. 10 illustrates a second instance of a highly conductive warp yarn that additionally constitutes part of one bus-bar. The use of two such warp yarns in each of the two bus-bars serves to further reduce the overall linear resistivity of said bus-bars. This further reduces unwanted power dissipation, and the number of such parallel bus-bar segments is a further mechanism by which the distribution of power dissipation may be controlled.

The two conductive weft yarns marked as 114 and 116 serve to interconnect each pair of parallel bus-bar segments. Yarns 114 and 116 additionally serve to direct the conductive path towards a convenient location at the periphery of the section of fabric, where an electrical connector may be appended.

Through this connector, a voltage may be applied across yarns 114 and 116 in order to effect heating. The absolute resistance value of the conductive path may be so predetermined as to achieve a specified power dissipation for a given applied voltage.

It is also advantageous within this type of application further to employ the resistive element as a temperature sensor, in order to monitor and control the heating process. This is achieved through the widely known techniques of resistance thermometry, whereby accurate measurements of resistance can be equated to temperature through knowledge of a conductive material's temperature coefficient of resistance.

Figure 13:
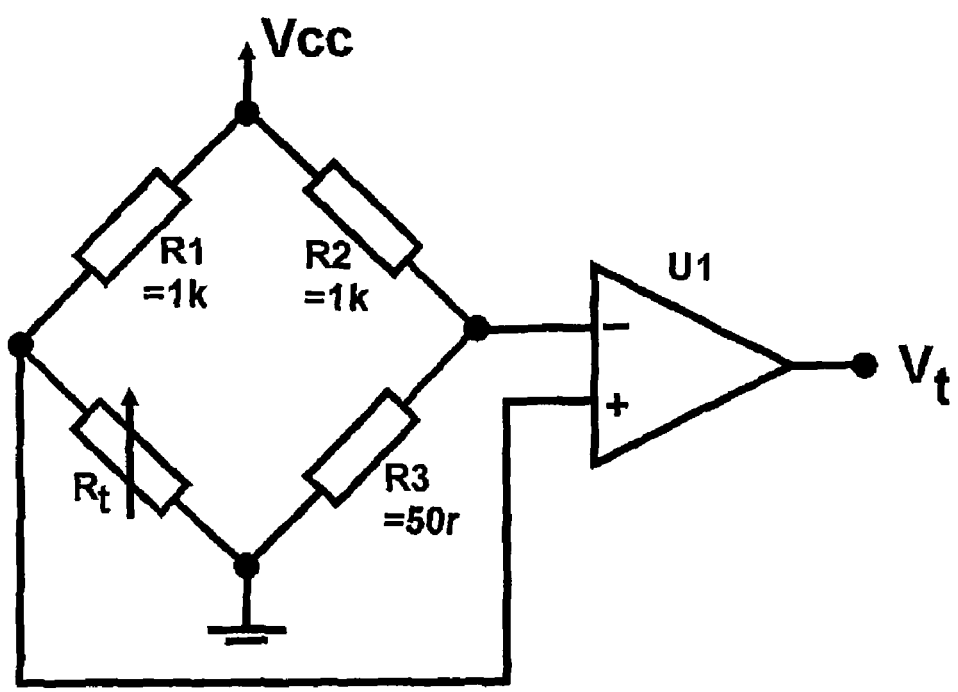
FIG. 13 is a schematic diagram of an embodiment of sensing circuit.

FIG. 13 illustrates a suitable measurement circuit for the determination of temperature from the fabric resistive element. R1, R2, R3 and $R_t$ are resistors that constitute a bridge circuit. Rt represents the total resistance of the conductive path within the section of fabric and between yarns 114 and 116 in FIG. 12. The value of R3 assumes that $R_t$ also approximates this value. U1 is an appropriate instrumentation amplifier or other differencing amplifier. Such an amplifier outputs a voltage, $V_t$, which is proportional to the resistance $R_t$ and thus the aggregate temperature of the conductive path within the fabric.

Similar circuitry and techniques can be applied in order to sense or measure a variety of conditions from the fabric in terms of a change in resistance within the conductive path. Resistance may be equated to the fabric's exposure to temperature, physical strain, humidity or moisture. Indeed, in some types of application, it is advantageous to apply electrical or computational filtering in order to isolate a desired electrical variable from the effects of extraneous conditions.

The disclosures in British patent application no. 0404419.4, from which this application claims priority, and in the abstract accompanying this application are incorporated herein by reference.

What is claimed is:

1. A fabric having a woven construction, including in its woven construction a plurality of spaced first elongated electrically conductive filaments or fibers and a plurality of spaced second elongated electrically conductive filaments or fibers, said first elongated electrically conductive filaments or fibers being crossed by said second elongated electrically conductive filaments or fibers at a plurality of crossover points,
wherein said plurality of crossover points consists of at least one instance of a crossover point at which the first and second electrically conductive filaments or fibers are permanently biased apart and at least one instance of a crossover point at which said corresponding first and second electrically conductive filaments or fibers are permanently physically connected together,
wherein said permanently connected crossover points and said permanently biased apart crossover points bring into being at least one conductive path within said fabric that is composed of two or more contiguous segments of two or more electrically conductive filaments or fibers, the conductive path being arranged in series in a serpentine manner.

2. A fabric as claimed in claim 1, wherein the fabric includes a warp and a weft and wherein the warp includes at least one said first electrically conductive filaments or fiber and the weft includes at least one said second electrically conductive filaments or fiber.

3. A fabric as claimed in claim 1, including insulating fibers or filaments which bias the first and second electrically conductive filaments or fibers apart at said crossover points.

4. A fabric as claimed in claim 3, wherein the woven construction includes yarn and warp and/or weft floats over or under more than one yarn to effect the biasing apart of first and second electrically conductive filaments or fibers at said crossover points.

5. A fabric as claimed in claim 4, wherein the first and/or second electrically conductive filaments or fibers are subject to a warp and/or weft float over or under more than one yarn.

6. A fabric as claimed in claim 4, including a warp and a weft and insulating warp fibers neighbouring an electrically conductive filaments or fiber in the warp, wherein the neighbouring insulating warp fibers to an electrically conductive filaments or fiber in the warp are subject to a warp float over or under more than one weft yarn.

7. A fabric as claimed in claim 4, including a warp and a weft and insulating weft fibers neighbouring an electrically conductive filaments or fiber in the weft, wherein the neighbouring insulating weft fibers to an electrically conductive filaments or fiber in the weft are subject to a weft float over or under more than one warp yarn.

8. A fabric as claimed in claim 1, wherein the one or more crossover points at which the corresponding first and second electrically conductive filaments or fibers are permanently physically connected together are effected by means of a plain weave structure local to that crossover point.

9. A fabric as claimed in claim 1, wherein the two or more contiguous segments are of two or more electrically conductive filaments or fibers that exhibit differing linear resistivities.

10. A fabric as claimed in claim 1, wherein the contiguous segments of electrically conductive filaments or fibers have a length and/or number and/or linear resistivity chosen so as to constitute one or more resultant conductive paths that conform to a required electrical characteristic and/or a required value of electrical property.

11. A fabric as claimed in claim 10, wherein the electrical property is selected from the group consisting of electrical resistance, capacitance, inductance, impedance and reactance.

12. A fabric as claimed in claim 10, wherein the electrical characteristic is a heterogeneous distribution of resistance along the resultant conductive path and/or across the fabric.

13. A fabric as claimed in claim 12, wherein the fabric provides an electrical heating element that exhibits a heterogeneous distribution of heated power dissipation along the resultant conductive path and/or across the fabric.

14. A fabric having a woven construction with a warp and a weft, the fabric including:
   I. several spaced elongated first electrically conductive elements included in the warp of the fabric;
   II. several spaced elongated second electrically conductive elements included in the weft of the fabric, and crossing the first electrically conductive elements at several crossover points; and
   III. elongated insulating elements in the warp and/or the weft of the fabric,
   wherein said crossover points consist of:
   A. one or more crossover points at which the first and second electrically conductive elements are permanently biased apart, the permanent biasing being effected by warp and/or weft floats of the first and/or second electrically conductive elements over or under more than one of the elongated insulating elements, and
   B. one or more crossover points at which the first and second electrically conductive elements are permanently in conductive communication, the permanent conductive communication being effected by a plain weave in the warp and weft at the crossover point,
   wherein the permanently biased apart crossover points and the crossover points in permanent conductive communication generate at least one conductive path within the fabric that includes two or more contiguous segments of two or more of the electrically conductive elements, the conductive path being arranged across two or more of the electrically conductive elements in series in a serpentine manner, the contiguous segments together having one or more of:
(1) a length,
(2) a number, and/or
(3) a linear resistivity,
with the conductive paths providing desired electrical characteristics.

15. The fabric of claim 14 wherein the warp includes:
a. elongated insulating elements, and
b. an elongated electrically conductive element neighboring the elongated insulating elements,
wherein the insulating elements include a warp float over or under more than one of the elements in the weft.

16. The fabric of claim 14 wherein the weft includes:
a. elongated insulating elements, and
b. an elongated electrically conductive element neighboring the elongated insulating elements,
wherein the insulating elements include a weft float over or under more than one of the elements in the warp.

17. The fabric of claim 14 wherein the two or more contiguous segments of two or more of the electrically conductive elements include electrically conductive elements having different linear resistivities.

18. The fabric of claim 14 wherein the desired electrical characteristics include one or more of:
a. resistance,
b. capacitance,
c. inductance,
d. impedance, and
e. reactance.

19. The fabric of claim 14 wherein the desired electrical characteristics include a heterogeneous distribution of resistance along one or more of:
a. the conductive path, and
b. the entire fabric.

* * * * *